United States Patent
Kim et al.

(10) Patent No.: US 7,561,474 B2
(45) Date of Patent: Jul. 14, 2009

(54) PROGRAM VERIFYING METHOD AND PROGRAMMING METHOD OF FLASH MEMORY DEVICE

(75) Inventors: Ju In Kim, Incheon-si (KR); Ju Yeab Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/965,552

(22) Filed: Dec. 27, 2007

(65) Prior Publication Data

US 2008/0298133 A1    Dec. 4, 2008

(30) Foreign Application Priority Data

May 28, 2007    (KR)    ............... 10-2007-0051525

(51) Int. Cl.
*G11C 11/34* (2006.01)
(52) U.S. Cl. ............... 365/185.22; 365/185.24
(58) Field of Classification Search ............ 365/185.22, 365/185.24
See application file for complete search history.

(56) References Cited

U.S. PATENT DOCUMENTS

| | | | |
|---|---|---|---|
| 7,130,222 B1 | 10/2006 | Ho et al. | |
| 7,206,225 B2 | 4/2007 | Wu | |
| 2006/0039198 A1* | 2/2006 | Guterman et al. | 365/185.28 |
| 2007/0171744 A1* | 7/2007 | Mokhlesi et al. | 365/203 |
| 2007/0211536 A1* | 9/2007 | Aritome | 365/185.22 |
| 2008/0158966 A1* | 7/2008 | Chen et al. | 365/185.16 |

FOREIGN PATENT DOCUMENTS

| | | |
|---|---|---|
| KR | 1020060044239 A | 5/2006 |
| KR | 1020060064856 A | 6/2006 |

* cited by examiner

*Primary Examiner*—Michael T Tran
(74) *Attorney, Agent, or Firm*—Townsend and Townsend and Crew LLP

(57) ABSTRACT

A duel program verify operation is performed using first and second verify voltages. In order to reduce the width of a threshold voltage distribution during an incremental step pulse program implementation, data of a corresponding memory cell are verified twice using the first verify voltage and the second verify voltage. During a second verify operation using the second verify voltage, a sensing current is adjusted by controlling voltages applied as a bit line select signal and an evaluation time period. Therefore, the threshold voltage of the memory cell can be measured higher or lower than its actual value and the width of a threshold voltage distribution is reduced.

15 Claims, 4 Drawing Sheets

PROGRAM VERIFYING METHOD AND PROGRAMMING METHOD OF FLASH MEMORY DEVICE

CROSS-REFERENCE TO RELATED APPLICATIONS

The present application claims priority to Korean application number 10-2007-0051525, filed on May 28, 2007, which is incorporated by reference in its entirety.

BACKGROUND OF THE INVENTION

The present invention relates to an operating method of a flash memory device, and more particularly, to a program verifying method of a NAND flash memory device and a programming method using the same.

Recently, there is a high demand for flash memory devices that are electrically programmable/erasable but do not require a refresh operation for rewriting data at regular periods. There has been a great effort to develop high-capacity flash memory devices capable of storing a large volume of data.

In this regards, a NAND flash memory device which includes a plurality of memory cells connected in series to form one string for achieving high degree of integration, are widely used. To increase storage capacity while reducing chip size, multi-level cell (MLC) devices that can store more than one bit per cell by choosing between multiple levels of electrical charge to apply to the floating gates of its cells are introduced. A multi-level cell can store two or more bits of information while a single level cell (SLC) can store only one bit of information, for example, a programmed state and an erased state. Therefore, the storage capacity of the MLC flash memory device is twice or more greater than that of the SLC flash memory device. Typically, the MLC has two or more threshold voltage distributions, and thus has two or more data storage states corresponding thereto.

A program operation of the MLC flash memory device is performed on a page basis. As a word line bias voltage for programming is applied to a word line connected to MLCs of a selected page, the MLCs are programmed. Recently, to increase the program speed of the MLC flash memory device, an incremental step pulse programming (ISPP) method of programming a selected page while incrementally increasing the word line bias voltage has been employed.

FIG. 1 illustrates threshold voltage distributions of a NAND flash memory device with a 2-bit MLC.

Referring to FIG. 1, in the MLC flash memory device where 2-bit data can be programmed in one memory cell, there are four possible data storage states(i.e., [11], [10], [01] and [00]), each corresponding to a threshold voltage distribution of the MLC. Typically, in the program process of the MLC flash memory device, the threshold voltage of a MLC is changed to a voltage associated with a data value to be stored. Each memory cell of the MLC flash memory device has a threshold voltage distribution 110 corresponding to an erased state (hereinafter, referred to as erased threshold voltage distribution for simplicity), and threshold voltage distributions 120, 130 and 140 corresponding to a plurality of programmed states (hereinafter, referred to as programmed threshold voltage distribution for simplicity). The programmed threshold voltage distributions 120, 130 and 140 are distinguished from the erased threshold voltage distribution 110 which is a first read voltage Vread0 (generally, 0 V). The programmed threshold voltage distributions 120, 130 and 140 are distinguished from each other by a second read voltage Vread1 a third read voltage Vread2, and a forth read voltage Vread4 respectively.

A fast programming speed of a memory device and a reduction in width of a distribution of a threshold voltage of a memory cell are considered very important in both SLC and MLC flash memory devices. As the MLC flash memory will be developed to have more dense cell configuration, from a current 4-level MLC to an 8 or more-level MLC, reducing the width of distribution of each threshold voltage of a memory cell will be more critical issues.

The programmed threshold voltage distributions 120, 130 and 140 are represented between the first read voltage Vread0 to a pass voltage Vpass in the MLC flash memory device. If the width of the threshold voltage distribution is reduced, the number of bits storable in one memory cell also increases, and thus larger volume of data can be stored in the flash memory device. Therefore, it is beneficial if the threshold voltage distribution is narrowed in the MLC flash memory device.

Since a conventional programming method of an MLC flash memory device employs the incremental step pulse program (ISSP) method, a method of reducing the magnitude of the step voltage can be used to reduce the width of distribution of threshold voltages. However, it is hard to reduce the magnitude of the step voltage unlimitedly because the reduction of the step pulse causes more program pulses and thus increases a programming time. Accordingly, it is necessary to develop a method that can effectively reduce the width of a threshold voltage distribution of a memory cell while not increasing a programming time in the memory cell.

SUMMARY OF THE INVENTION

Embodiments of the present invention are directed to a program verifying method and a programming method of a flash memory device, which are capable of reducing the width of a threshold voltage distribution of a memory cell.

In one embodiment, a program verifying method of a flash memory device having a selected first bit line and an unselected second bit line of which each bit line has a plurality of memory cells is provided. The program verifying method includes precharging the first bit line, applying a first verify voltage to word lines of selected memory cells, and a pass voltage (Vpass) to word lines of the other memory cells. The program verifying method further includes evaluating the memory cells for a first time period, sensing programmed states of the selected memory cells for a second time period to determine whether the charges accumulated in the first bit line are discharged.

Subsequently, the first bit line is precharged. The program verifying method includes applying a second verify voltage to a word line of a memory cell among the selected memory cells, of which a threshold voltage does not exceed the first verify voltage, and applying the pass voltage to word lines of the other memory cells. The memory cells are evaluated for a third time period. A programmed state of the selected memory cell is evaluated for a fourth time period to determine whether the charges accumulated in the precharged first bit line are discharged.

In an aspect of the method, before the precharging of the first bit line, the program verifying method may further include discharging the first and second bit lines and setting a page buffer connected to the first and second bit lines. The second verify voltage may have the same magnitude as the first verify voltage. The third time period may be shorter than the first time period. The fourth time period may be shorter than the second time period.

In another embodiment, a programming method of a flash memory device having a selected first bit line and an unselected second bit line of which each bit line has a plurality of memory cells is provided. The programming method includes programming the memory cells to a predetermined program voltage, performing a first verify operation to verify programmed states of the memory cells using a first verify voltage and performing a second verify operation to verify programmed states of the memory cells not passing the first verify operation using a sensing current lower than that of the first verify operation. and the programming method further includes programming the memory cells passing and not passing the second verify operation to a predetermined level using different step voltages, respectively.

The different step voltages include a voltage ranging from approximately 0.5 V to approximately 1 V that may be applied to a bit line of the first set of memory cells, and a ground voltage that may be applied to a bit line of the second set of memory cells.

The performing of the second verify operation includes precharging the first bit line, applying a second verify voltage to a word line of the memory cell and a pass voltage (Vpass) to word lines of the other memory cells, and evaluating the memory cells for a predetermined time. Before the precharging of the first bit line, the programming method may further include discharging the first and second bit lines and setting a page buffer connected to the first and second bit lines.

The performing of the second verify operation includes sensing programmed states of the selected memory cells according to whether charges accumulated in the first bit line are discharged.

DESCRIPTION OF SPECIFIC EMBODIMENTS

Hereinafter, a program verifying method and a programming method of a flash memory device in accordance with embodiments of the present invention will be described in detail with reference to the accompanying drawings.

To reduce the magnitude of a step voltage without increasing a programming time, a program verify operation may be performed using two verify voltages. A first verify voltage (PV) is a target verify voltage, and a second verify voltage (PV') has a voltage level slightly lower than the first verify voltage (PV). This is significantly different from a conventional method where one specific-level verify voltage was used. If a threshold voltage of a memory cell exceeds the second verify voltage (PV'), a channel bias of a corresponding memory cell transistor increases through bit lines. Hence, the width of a threshold voltage distribution can be reduced by applying a step bias to a memory cell that exceeds the second verify voltage (PV'). The magnitude is substantially lower than that of a step bias applied to a memory cell that does not exceed the second verify voltage (PV'). In an aspect of the present invention, a second verify voltage is not directly applied to a word line of a memory cell while the first verify voltage (PV) is applied to a word line of the memory cell and a sensing current ($I_{trip}$) is reduced by controlling voltages (V1, V2) applied as bit line select signal BSL and an evaluation time during the program verify operation. It is possible to achieve the effect of applying the second verify voltage (PV') to the word line of a memory cell using such a property that the threshold voltage of the memory cell is measured higher than its actual value by having the sensing current ($I_{trip}$) low.

Figure 1:
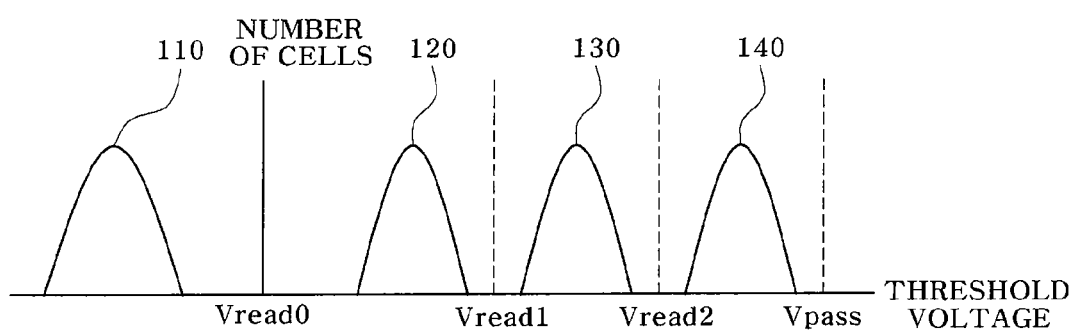
FIG. 1 illustrates threshold voltage distributions of a NAND flash memory device with a 2-bit multi level cell (MLC).
Figure 2:
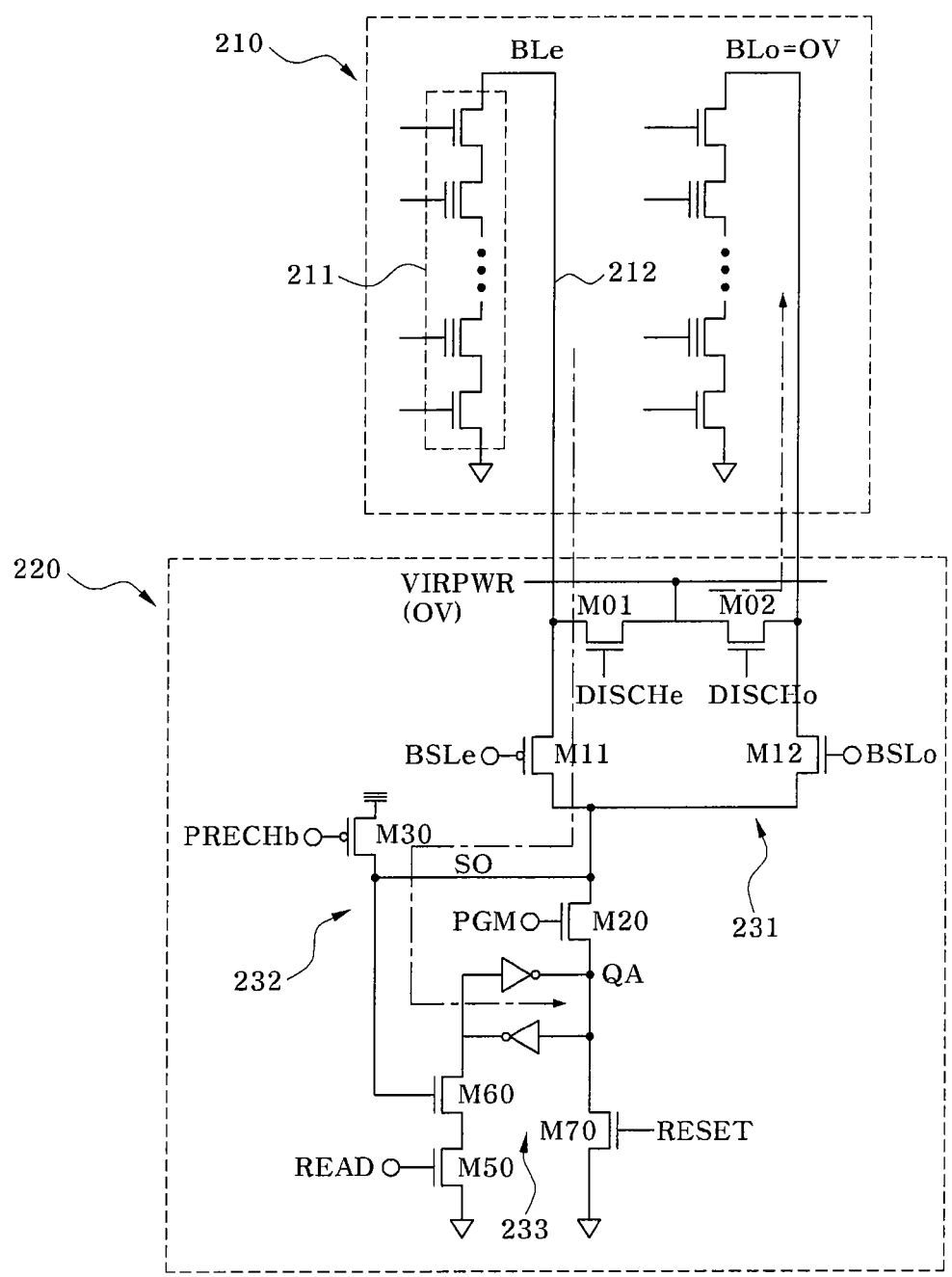
FIG. 2 illustrates a circuit diagram of a cell array and a page buffer in a NAND flash memory.

FIG. 2 illustrates a circuit diagram of a cell array and a page buffer in a NAND flash memory, setting forth a program verifying method of a flash memory device according to an embodiment of the present invention.

A flash memory device includes a cell array 210 as a data storage region. The cell array 210 of the flash memory device includes a plurality NAND strings 211 arranged in a word line direction. The NAND string 211 includes select transistors and a plurality of memory cells, which are connected in series. Each of the NAND strings 211 is connected to a corresponding bit line 212 and also connected to a page buffer 220 through the bit line 212. An even bit line BLe and an odd bit line BLo form a bit line pair, and they are connected to a page buffer 220.

The page buffer 220 includes a bit line select/bias supply circuit 231, a precharge circuit 232 configured to precharge the bit line, and a latch 233 configured to store data. The bit line select/bias supply circuit 231 is configured to select one of the even bit line BLe and the odd bit line BLo and apply a bias to the selected bit line. The bit line select/bias supply circuit 231, the precharge circuit 232 and the latch 233 are connected to each other through a sensing node S0. The latch 233 is connected to an output node QA.

The magnitude of sensing current ($I_{trip}$) flowing from the NAND string 211 to the sensing node S0 of the page buffer 220 through the bit line 212 may be calculated from an equation below.

$$I_{trip} = (C_{BL} \times (V1 - V2))/tEVAL,$$

where $I_{trip}$ is the sensing current, $C_{BL}$ is a bit line capacitance, V1 and V2 are voltages applied to bit lines BSLe and BSLo, and tEVAL is an evaluation time.

From the above described equation, it is appreciated that the sensing current ($I_{trip}$) can be increased by decreasing V2 or by shortening the evaluation time (tEVAL). In general, if the sensing current ($I_{trip}$) increases in a flash memory device, a threshold voltage measurement of a memory cell is lower than its actual value. Therefore, by controlling V2 and the evaluation time (tEVAL), it is possible to change the magnitude of the sensing current ($I_{trip}$) in order to change the threshold voltage measurement of the memory cell.

Figure 3:
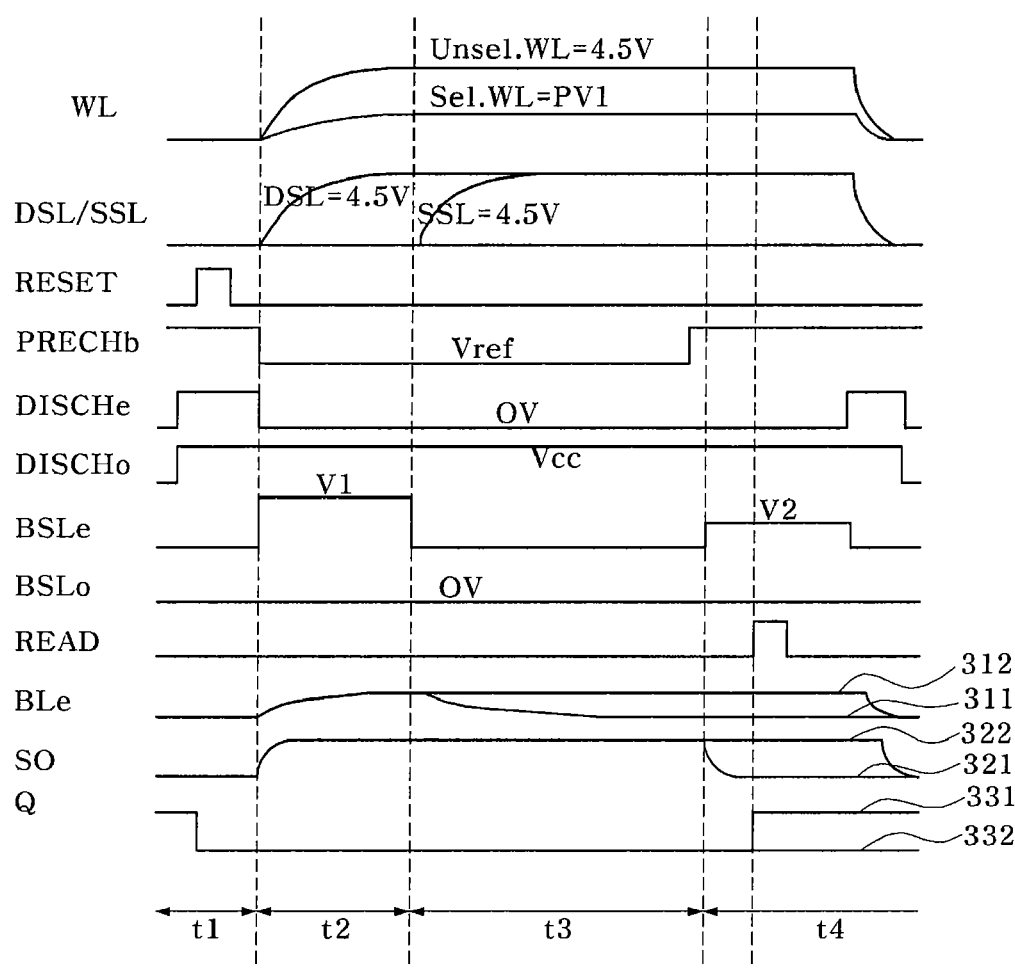
FIG. 3 illustrates a timing diagram of signals during a first verify operation in a program verifying method of a flash memory device according to the present invention.
Figure 4:
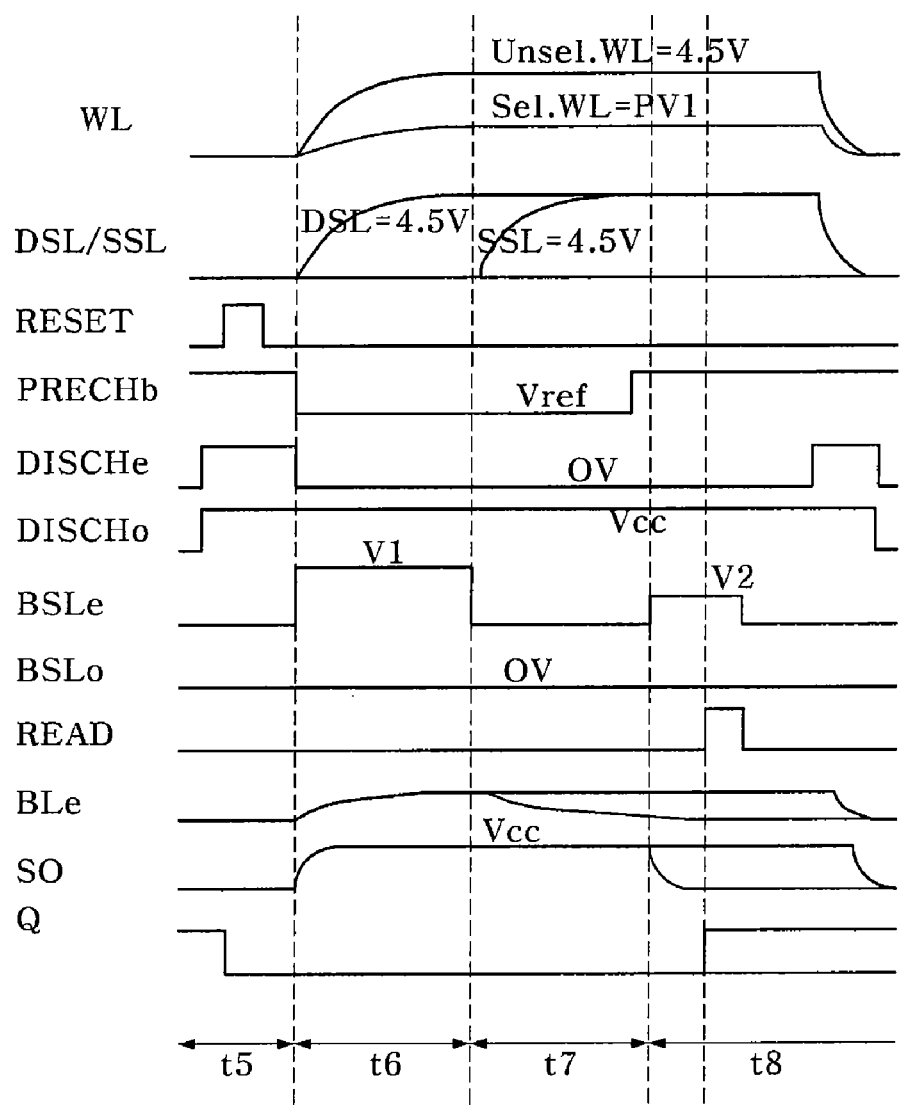
FIG. 4 illustrates a timing diagram of signals during a second verify operation in a program verifying method of a flash memory device according to the present invention.

FIGS. 3 and 4 illustrate a program verifying method of a flash memory device according to the present invention.

Referring now to FIG. 3, a timing diagram of signals during a first verify operation is depicted in accordance with an embodiment of the present invention. In a double verify operation for reducing the width of a threshold voltage distribution during an incremental step pulse program (ISSP) implementation, data of a corresponding memory cell are verified twice using the first verify voltage (PV) and the second verify voltage (PV'). In the case of performing a first program verify operation using the first verify voltage PV, the first verify voltage (PV) is applied to the word line of the memory cell. However, in the case of performing a second program verify operation using the second verify voltage (PV'), the sensing current is increased while the first verify voltage (PV) is continuously applied to the word line of the memory cell. As described above in conjunction with the equation, the sensing current is increased by reducing the evaluation time or by reducing the magnitude of the voltage V2. The magnitude of the voltage V2 is reduced by shortening a supply duration of the voltage V2 applied to a bit line select transistor of the page buffer 220.

Before reading data of the memory cell to verify a programmed state of the memory cell, the charges accumulated in the bit line are discharged, and the page buffer 220 is then set to an initial state (first section t1 of FIG. 3). When discharge signals (e.g., DISCHe and DISCHo) and a precharged signal (PRECHb) of logic high levels are inputted, NMOS transistors M01 and M02 are turned on but a PMOS transistor M30 is turned off. A power line VIRPWR is grounded to 0 V. Since the NMOS transistors M01 and M02 are turned on, all the charges accumulated in the even bit line BLe and the odd bit line BLo exit to the power line VIRPWR through the NMOS transistors M01 and M02. As a result, both the even bit line BLe and the odd bit line BLo are discharged. When a reset signal RESET of logic high level is applied, a transistor M70 is turned on to set the output node QA to a low state.

A low level signal is applied to gates of a drain select transistor, a source select transistor and a memory cell transistor in the cell string 211.

The selected bit line BLe is precharged for sensing data (second section t2 of FIG. 3). From a start point of the second section t2, a pass voltage Vpass is applied to a drain select line DSL, thus turning on a drain select transistor. In one embodiment, the pass voltage Vpass is approximately 4.5 V. The first verify voltage PV1 or the pass voltage is applied to the word line of the memory cell transistor. Specifically, the first verify voltage PV1 is applied to a word line of a selected memory cell transistor, and the pass voltage Vpass is applied to word lines of the other unselected memory cells so that the other unselected memory cells can be turned on irrespective of their states.

In the page buffer 220, the discharge signal DISCHe and the precharge signal PRECHb are at a logic low level of a ground voltage when the power line VIRPWR of the page buffer 220 is grounded. The bit line select signal BSLe of logic high level is applied while the bit line select signal BSLo is maintained at logic low level. As a result, the NMOS transistors M01 and M02 are turned off while the PMOS transistor M30 is turned on. After the PMOS transistor M30 is turned on, Vcc is applied to the sensing node S0. When a signal corresponding the voltage V1, e.g., approximately 2 V, is applied to the bit line select signal BSLe, the voltage of the even bit line BLe gradually rises up. The even bit line BLe is precharged to a predetermined voltage level by a voltage difference of V1–Vth. Because the NMOS transistor M12 is turned off and the NMOS transistor M02 is turned on, 0 V continues to be applied to the odd bit line BLo that is not selected.

The pass voltage Vpass (e.g., approximately 4.5 V) is applied to the source select line SSL of the NAND string during a third section (t3 of FIG. 3) to turn on a source select transistor. Consequently, current may or may not flow through the NAND string depending on a state of the selected memory cell. The bit line select signal BSLe having logic low level is applied to evaluate the memory cell. The charges accumulated in the precharged bit line may be discharged or may remain in entirety depending on a programmed state of the selected memory cell. The evaluation time is set to such a condition that charges accumulated in the selected even bit line BLe are sufficiently discharged.

After the lapse of the evaluation time, the transistors and the latch of the page buffer are appropriately controlled to sense the state of a memory cell, i.e., whether or not the memory cell is programmed to a target level, and then to latch the sensed data (fourth section t4 of FIG. 3). The precharge signal PRECHb goes to logic high level to turn off the PMOS transistor M30. The voltage V2 having a voltage level lower than the voltage V1 is applied as the bit line select signal BSLe.

In the case where the threshold voltage of the selected memory cell does not exceed the first verify voltage PV1, the selected memory cell transistor is turned on. Therefore, the charges accumulated in the even bit line BLe are discharged to a memory cell, thus reducing a voltage 311 of the even bit line BLe. as a result, a gate-source voltage Vgs of the NMOS transistor M11 becomes higher than the threshold voltage of the NMOS transistor M11, thereby turning on the NMOS transistor M11. As the NMOS transistor M11 is turned on, the charges accumulated in the sensing node S0 are rapidly discharged to the even bit line BLe due to the charge distribution between the even bit line BLe and the sensing node S0. Consequently, the voltage of the sensing node S0 drops to 0 V from the power supply voltage Vcc.

In the case where the threshold voltage of the selected memory cell exceeds the first verify voltage PV1, the selected memory cell transistor is turned off. In such a case, the charges accumulated in the even bit line BLe cannot be discharged to a memory cell, and thus the even bit line BLe is maintained at (V1–th) level 312. Accordingly, though the voltage V2 is applied as the bit line select signal BSLe, the gate-source voltage Vgs of the NMOS transistor M11 is still maintained at a level of the threshold voltage, and hence the NMOS transistor M11 is not turned on. As a result, a voltage 322 of the sensing node S0 may maintain the power voltage Vcc.

Subsequently, the sensed data are latched. When the threshold voltage of the memory cell transistor does not exceed the first verify voltage PV1 and thus the selected memory cell transistor is turned on, the NMOS transistor M60 maintains its turn-off state as the voltage of the sensing node S0 drops to 0 V. Therefore, the output node QA maintains its logic low level. When the selected memory cell transistor is turned off because the threshold voltage of the selected memory cell transistor exceeds the first verify voltage PV1, the voltage of the sensing node S0 maintains the power voltage Vcc to turn on the NMOS transistor M60. The output node QA goes to logic high level from logic low level.

After the first verify operation is completed, a second verify operation is performed on a memory cell of which threshold voltage does not exceed the first verify voltage PV1.

During the second verifying operation, the second verify voltage PV1' is not directly applied to the word line of the memory cell. Instead, a supply duration of the bit line select signal BLe applied to the selected bit line and the evaluation time are reduced, which shortens a verification time while providing the same effect that the second verify voltage PV1' is applied to the word line of the memory cell.

Referring to FIG. 4, a timing diagram of signals during a second verify operation is depicted in accordance with an embodiment of the present invention. In a section t5, the bit lines are discharged and the page buffer is set. In a section t6, the selected bit line is precharged are performed in the same manner as those of the discharge section of the first verify operation, (t1 of FIG. 3), and the precharge section of the first verify operation (t2 of FIG. 3). Therefore, through the operations in the sections t5 and t6, the bit lines BLe and BLo are discharged and the selected even bit line BLe is precharged. It is noted that the first verify voltage PV1, not the second verify voltage PV1', is applied to the word line of the selected memory cell. Further, the pass voltage Vpass, e.g., approximately 4.5 V, is applied to the word lines of the unselected memory cells such that current flows through the NAND string regardless of states of the unselected memory cells.

When the pass voltage Vpass of approximately 4.5 V is applied to a source select line SSL of the NAND string to thereby turn on the source select transistor, the current may or may not flow through the selected NAND string depending on the state of the memory cell. The bit line select signal BSLe having logic low level is applied to evaluate the memory cells in a section t7. The charges accumulated in the precharged bit line are discharged or remain in entirety depending on a programmed state of the selected memory cell. As described above, the evaluation time in the second verify operation is set shorter than that of the first verify operation. Since data sensing is achieved in such a state that the charges accumulated in the bit line BLe are not sufficiently discharged, the threshold voltage of the memory cell may be sensed higher than its actual value. In other words, this provides the effect that the verify voltage is lowered.

After the lapse of a predetermined evaluation time, the state of the memory cell, i.e., whether the memory cell is programmed to a target level or not, is sensed by appropriately controlling the transistors and the latch of the page buffer, and the sensed data are latched (section t8). As the precharge signal PRECHb goes to logic high level, the PMOS transistor M30 is turned off. The bit line select signal BSLe, i.e., the voltage V2 smaller than the voltage V1, is applied. Likewise, the supply duration of the voltage V2 is set shorter in the second verify operation than the first verify operation, which provides the same effect of the reduced magnitude of the voltage V2.

Operations of sensing and latching the data of the memory cell are performed in the same manner as the first verify operation, and thus further detailed description will be omitted herein.

When the threshold voltage of the memory cell is higher than the first verify voltage PV1, the power voltage Vcc is applied to the bit line so that a channel is boosted. Therefore, the memory cell is not programmed any longer, and as a result the threshold voltage is sensed higher than the second verify voltage PV1'. When the threshold voltage of the memory cell is lower than the first verify voltage PV1 but higher than the second verify voltage PV1', a voltage ranging from approximately 0.5 V to approximately 1 V, which is lower than the power voltage Vcc, is applied to the bit line in a program operation. Hence, a memory cell is programmed such that a sensed step bias of the memory cell is lower than an applied step bias, which makes it possible to reduce the width of a threshold voltage distribution. When the threshold voltage of the memory cell is lower than the first verify voltage PV1 and the second verify voltage PV1', 0 V is applied to the bit line so that the cell is programmed by the applied step bias.

According to the program verifying method of the flash memory device in accordance with the present invention, a double verify operation is performed using first and second verify voltages (PV1, PV1'). During a second verify operation using the second verify voltage (PV1'), the verify voltage is not directly applied to a word line of a memory cell, but only the first verify voltage (PV1) is applied to the word line of the memory cell in a program verify operation and a sensing current ($I_{trip}$ point) is reduced by controlling voltages V1 and V2 applied as a bit line select signal (BSL) and an evaluation time. Therefore, the threshold voltage of the memory cell can be measured higher than its actual value. Accordingly, it is possible to achieve the effect of the double verify operation and to reduce an evaluation time and a supply duration of a voltage V2 as well, thus reducing a program verification time.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A program verifying method of a flash memory device, the flash memory device comprising a selected first bit line and an unselected second bit line of which each bit line includes a plurality of memory cells, the program verifying method comprising:
   precharging the first bit line;
   applying a first verify voltage to word lines of first selected memory cells, and a pass voltage (Vpass) to word lines of the other memory cells that are not selected;
   evaluating the memory cells during a first time period;
   sensing programmed states of the first selected memory cells during a second time period to determine whether charges accumulated in the first bit line are discharged;
   precharging the first bit line after sensing the programmed states of the first selected memory cells;
   selecting at least one second selected memory cell from the first selected memory cells, the second selected memory cell being a cell that has a threshold voltage that does not exceed the first verify voltage;
   applying a second verify voltage to a word line of the second selected memory cell while applying the pass voltage to word lines of the other memory cells;
   evaluating the memory cells during a third time period; and
   sensing a programmed state of the second selected memory cell during a fourth time period to determine whether charges accumulated in the precharged first bit line are discharged.

2. The program verifying method of claim 1, further comprising, before the precharging of the first bit line:
   discharging the first and second bit lines; and
   resetting a page buffer connected to the first and second bit lines.

3. The program verifying method of claim 1, wherein the second verify voltage has substantially the same magnitude as the first verify voltage.

4. The program verifying method of claim 1, wherein the third time period is shorter than the first time period.

5. The program verifying method of claim 1, wherein the fourth time period is shorter than the second time period.

6. A programming method of a flash memory device, the flash memory device comprising a selected first bit line and an unselected second bit line of which each bit line includes a plurality of memory cells, the programming method comprising:
   programming the memory cells to a predetermined program voltage;
   performing a first verify operation to verify programmed states of the memory cells using a first verify voltage;
   performing a second verify operation, using a sensing current lower than that of the first verify operation, to verify programmed states of the memory cells that have not passed the first verify operation; and
   programming a first set of memory cells and a second set of memory cells to a predetermined level using different step voltages, respectively, wherein the first set of memory cells have passed the second verifying test and the second set of memory cells have not passed the second verifying test.

7. The programming method of claim 6, wherein the performing of the second verify operation comprises:
- precharging the first bit line;
- applying a second verify voltage to a word line of the memory cell, and a pass voltage (Vpass) to word lines of the other memory cells;
- evaluating the memory cells for a predetermined time; and
- sensing programmed states of the selected memory cells to determine whether the charges accumulated in the first bit line are discharged.

8. The programming method of claim 6, further comprising, before the precharging of the first bit line:
- discharging the first and second bit lines; and
- setting a page buffer connected to the first and second bit lines.

9. The programming method of claim 6 or 7, wherein the second verify voltage has the same magnitude as the first verify voltage.

10. The programming method of claim 7, wherein the predetermined time for evaluating the memory cells is shorter than an evaluation time of the first verify operation.

11. The programming method of claim 7, wherein a time taken for sensing the programmed state of the memory cell is shorter than a sensing time of the first verify operation.

12. The programming method of claim 6, wherein the different step voltages include a voltage ranging from approximately 0.5 V to approximately 1 V that is applied to a bit line of the first set of memory cells, and a ground voltage that is applied to a bit line of the second set of memory cells.

13. A program verifying method of a flash memory device, the flash memory device comprising a selected first bit line and an unselected second bit line of which each bit line includes a plurality of memory cells, the program verifying method comprising:
- verifying the memory cells with a first verify voltage during a first evaluation time period;
- selecting at least one memory cell from the selected memory cells that has a threshold voltage that does not exceed the first verify voltage;
- applying a second verify voltage to a word line of the at least one memory cell while applying the pass voltage to word lines of the memory cells that are not selected;
- evaluating the memory cells during a second evaluation time period, wherein the second evaluation time period is shorter than the first evaluation time period; and
- sensing a programmed state of the at least one selected memory cell.

14. The method of claim 13, wherein the second evaluation time period is controlled to adjust a sensing current.

15. The method of claim 14, wherein the adjusted sensing current causes the second verifying voltage to be recognized higher than its actual value.

* * * * *